United States Patent [19]
Boettcher et al.

[11] Patent Number: 5,248,805
[45] Date of Patent: Sep. 28, 1993

[54] RADIATION-SENSTIVE, ETHYLENICALLY UNSATURATED, COPOLYMERIZABLE COMPOUNDS AND THEIR PREPARATION

[75] Inventors: Andreas Boettcher, Nussloch; Gerd Rehmer, Beindersheim, both of Fed. Rep. of Germany

[73] Assignee: BASF Aktiengesellschaft, Ludwigshafen, Fed. Rep. of Germany

[21] Appl. No.: 841,767

[22] Filed: Mar. 2, 1992

Related U.S. Application Data

[63] Continuation of Ser. No. 448,993, Dec. 12, 1989, abandoned.

[30] Foreign Application Priority Data

Dec. 31, 1988 [DE] Fed. Rep. of Germany ....... 3844444

[51] Int. Cl.$^5$ ................. C08F 2/50; C08F 18/24; C07C 69/96
[52] U.S. Cl. .................... 558/270; 558/265; 558/266; 558/267; 558/268; 558/269; 558/271; 522/14; 522/26; 522/39; 522/42; 522/46; 522/103; 522/183; 522/905; 522/904; 526/314
[58] Field of Search ............ 558/267, 268, 269, 270, 558/271; 522/46, 904, 905

[56] References Cited

U.S. PATENT DOCUMENTS

| | | | |
|---|---|---|---|
| 2,384,124 | 9/1945 | Muskat | 526/291 |
| 3,716,571 | 2/1973 | Berlin | 526/314 |
| 3,748,133 | 7/1973 | Noonan | 430/288 |
| 4,559,371 | 12/1985 | Hüsler et al. | 522/39 |
| 4,737,559 | 4/1988 | Kellen | 526/291 |
| 4,739,052 | 4/1988 | Hüsler et al. | 544/174 |

FOREIGN PATENT DOCUMENTS

| | | |
|---|---|---|
| 62470/86 | 4/1987 | Australia . |
| 12624/88 | 9/1988 | Australia . |
| 13763/88 | 9/1988 | Australia . |

(List continued on next page.)

OTHER PUBLICATIONS

J. of Radiation Curing Jul. 1987–Photoinitiators of Polymerization: . . . Giuseppe Li Bassi.

(List continued on next page.)

*Primary Examiner*—Marion E. McCamish
*Assistant Examiner*—Arthur H. Koeckert
*Attorney, Agent, or Firm*—Keil & Weinkauf

[57] ABSTRACT

Radiation-sensitive, ethylenically unsaturated compounds and a process for their preparation. The ethylenically unsaturated organic compounds are of the general formula $$R-\underset{\underset{O}{\|}}{C}-R^1$$

where
R is alkyl, aryl or a radical $R^1$ and
$R^1$ is a radical

[benzene ring with substituents $R^2$, $R^3$, $R^4$, $R^5$, $R^6$]

where $R^2$ to $R^6$ are each H, alkyl, OH, OAlkyl, SH, SAlkyl, halogen, N (Alkyl)$_2$ or N (Alkyl) (Aryl) and at least one but not more than three of the radicals $R^2$ to $R^6$ is or are a radical $$-O-\underset{\underset{O}{\|}}{C}-O-X-Z-\underset{\underset{O}{\|}}{C}-\underset{\underset{Y}{|}}{C}=CH_2 \text{ or}$$

$$-O-\underset{\underset{O}{\|}}{C}-O-X-Z-CH=CH_2$$

where X is alkylene, cycloalkylene, oxaalkylene or arylene, Y is H or CH$_3$— and Z is O or NY.

The novel radiation-sensitive ethylenically unsaturated compounds are suitable for the preparation of polymeric radiation-sensitive compounds.

2 Claims, No Drawings

FOREIGN PATENT DOCUMENTS

| | | |
|---|---|---|
| 0083185 | 7/1983 | European Pat. Off. . |
| 2100722 | 1/1983 | United Kingdom . |
| 2108487 | 5/1983 | United Kingdom . |
| 2108979A | 5/1983 | United Kingdom . |

OTHER PUBLICATIONS

Houben–Weyl, Methoden Der Organischen Chemie, Petersen et al. pp. 101–111, Band VIII, 1952.

Houben–Weyl, Band VII/2a, 1973, Müller pp. 186, 681.

Ullmann's Encyclopedia of Industrial Chemistry, Fifth, Completely Revised Edition, vol. A5: Cancer Chemotherapy to Ceramic Colorants pp. 197–202.

Kirk–Othmer, Encyclopedia of Chemical Technology, Third Ed. vol. 4, Blood, Coagulants and Anticoagulants to Cardiovascular Agents, John Wiley & Sons pp. 758–771.

Can. J. Chem. vol. 56, 1978, Fyles et al. pp. 1031–1042.

Journal of Polymer Science: Polymer Symposium 66 an Interscience Publication, Preparation of Polymerizable Derivatives of N-(4-Aminobenzenesulfonyl-N-'-Butylurea, Oberfeigner et al., pp. 42–52.

Polymerisation De Monomeres A Structures Biologiques, Pinazzi et al. European Polymer Journal, vol. 14, pp. 205–209.

Annalen Der Chemie, Bamd 601, Verlag Chemie GmbH, Kuhn, Vinylierung, pp. 80–139.

Journal Für Praktische Chemie, Band 317, Heft 1, 1979 pp. 62–72 Ostrogovich et al.

Journal f. prakt. Chemie, Band 317, Heft 1, 1975, pp. 81–85, Csunderlik et al.

RADIATION-SENSTIVE, ETHYLENICALLY UNSATURATED, COPOLYMERIZABLE COMPOUNDS AND THEIR PREPARATION

This application is a continuation of application Ser. No. 07/448,993, filed on Dec. 12, 1989 now abandoned.

The present invention relates to novel radiation-sensitive, ethylenically unsaturated phenone derivatives and a process for their preparation.

UV-sensitive aceto- and benzophenones are frequently added as external initiators to radiation-sensitive polymers (e.g. G. Li Bassi, J. Rad. Cur. 14 (1987), 18). In general, however, such procedures are not completely satisfactory since, after the initiator has been mixed with the polymer, problems with the compatibility, the uniformity of the distribution, the volatility, the odor, the toxicity, the exudation and the migration of the additive are encountered, frequently leading to an undesirable, premature and non-uniform reaction. In the actual exposure process, lower reactivity is then observed owing to lower effective initiator concentrations, and a number of troublesome secondary reactions are observed after exposure.

It is known that some of the stated problems can be solved if the radiation-sensitive initiator is copolymerized with monomers by a conventional process, i.e. is incorporated in a polymer chain. The photosensitive initiator is linked to the base polymer by means of an anchor group, i.e. the spacer. The spacer also serves to reduce the influence of the base polymer chain on the photochemical behavior of the initiator.

In principle, therefore, copolymerizable initiators have the following structure:

Scheme I

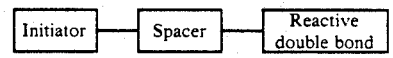

U.S. Pat. Nos. 3,214,492, 3,429,852, 3,622,848 and 4,304,895 describe acryloxy- or methacryloxy-substituted aceto- and benzophenone derivatives, for example

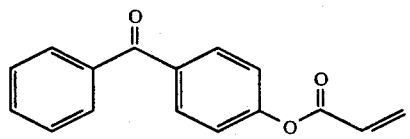

These can be copolymerized with ethylene or other vinyl monomers to give polymers which can be cured by irradiation, for example after thermal forming. In the model according to Scheme I, the reactive double bond and the initiator are separated by the carbonyloxy group as a spacer in the case of these radiation-sensitive monomers. From the photochemical point of view, these compounds are of less interest since the acryloyl substituent has a very pronounced influence on the absorption of the initiator fragment at long wavelengths.

A similar situation is also observed in the case of the copolymerizable acetophenone acrylates described in DE-A-35 34 645,

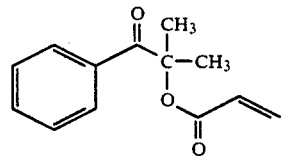

in which the photoreactivity is reduced by virtue of the fact that the reactive acrylate group is too closely coupled to the carbon atom a to the carbonyl group. The reason for this behavior is that, during the photochemically initiated a cleavage, a further, not very reactive radical is formed in addition to the benzoyl radical.

To avoid substantially reducing the photochemical reactivity of the copolymerizable initiator compared with the-parent substance, the reactive double bond must be decoupled mesomerically and inductively from the photoinitiator moiety.

In 2-acryloylthioxanthone (Eur. Polym. J. 23 (1987), 985)

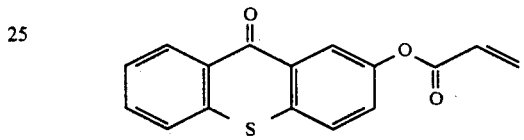

the separation has not yet been completely achieved. The copolymer with methyl methacrylate is less reactive than 2-hydroxythioxanthone.

In 4-(4'-vinylbenzyloxy)-benzophenone,

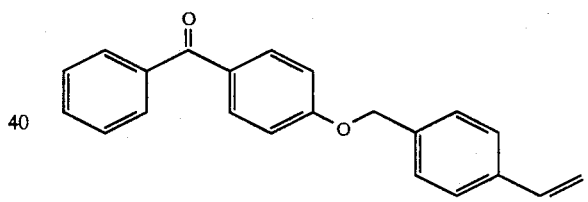

described in DE-A-28 18 763, the styrylbenzyloxy radical proves to be a good spacer.

In Uvecryl ® P36, a commercial product from UCB, a particularly long spacer consisting of four ethyleneoxy units separates the benzophenone from the acryloxy radical.

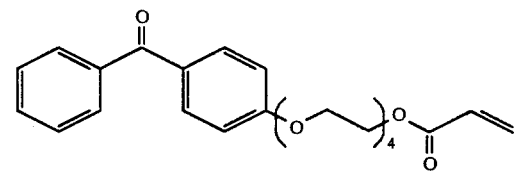

This compound, which is described in, for example, Technical Bulletin 2480/885 (1985) of UCB or in New Polym. Mat. 1 (1387), 63, can be used in photopolymers for coating materials. The synthesis is expensive, and this product has only moderate photochemical reactivity since the spacer is too long.

The introduction of functional groups into the spacer does not significantly influence the photochemical behavior of the chromophore if they are separated from one another by an alkyleneoxy group. The benzophenone derivatives of the type

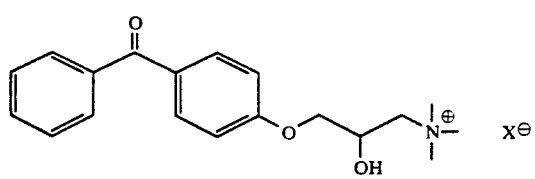

mentioned in EP-A-279 475 are examples of this.

According to the abovementioned prior art, an ether or ester group should therefore form part of the spacer (Scheme II).

Scheme II

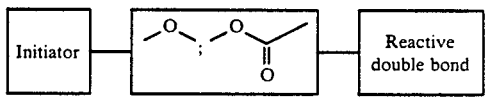

A novel spacer scheme is obtained by considering the influence and the function of the spacer as a substituent on the photochemically excited aceto- or benzophenone fragment. For example, possible spacers are those which, owing to their structure, can have a stabilizing or destabilizing effect.

In particular, the carbamoyl-substituted benzophenones of the type

Scheme III

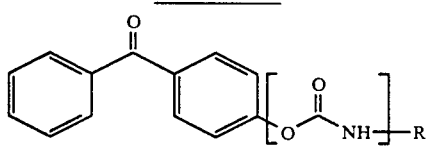

constitute an interesting class of substances from this point of view. U.S. Pat. No. 3,322,818 describes allyl- or methallyl-substituted carbamoylbenzophenones. However, they are only suitable as fungicides (cf. Scheme IV).

Scheme IV

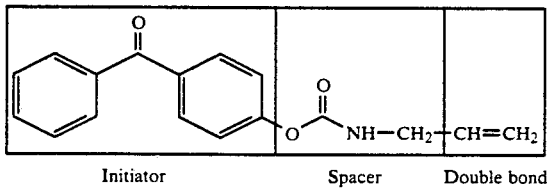

An allyl or methallyl group is unsuitable for copolymerizations. These benzoylphenyl allyl carbamates are therefore of no practical importance in the polymer sector.

Novel but photochemically less reactive monomers having an extremely long spacer are described in British Patent 2,100,722.

Finally, DE-A-3 820 463 claims monomers of the type (Scheme V)

Scheme V

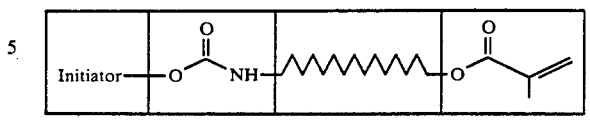

which are particularly reactive and conveniently obtainable from hydroxyaromatics and (meth)acryloylalkyl isocyanates. The necessary isocyanates, for example

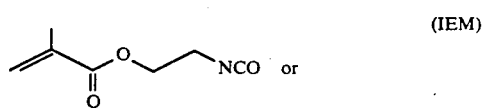 (IEM)

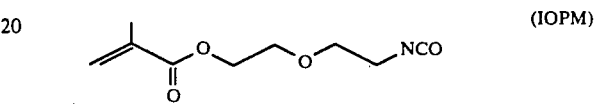 (IOPM)

are, however, very toxic and expensive to prepare.

It is an object of the present invention to provide radiation-sensitive, ethylenically unsaturated phenone derivatives, for example acetophenone, benzophenone or thioxanthone derivatives, which are readily obtainable and contain a spacer optimally tailored to the photoinitiator moiety.

A number of aceto- and benzophenone carbonates are known for various obligations.

In the total synthesis of griseofulvin (A. C. Day et al., J. Chem. Soc. 1961, 4067), the compound

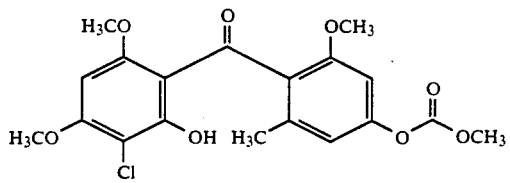

is used as an intermediate. Further examples of pharmacologically interesting carbonates of the abovementioned type are described in J. Chem. Soc. C 1969, 1721; ibid 1970, 392; Tetrahedron Lett. 1979, 4363, and Dutch Patent 7,008,636.

According to Japanese Preliminary Published Applications 54-002323 and 57-181001, the halogenated benzophenone carbonates

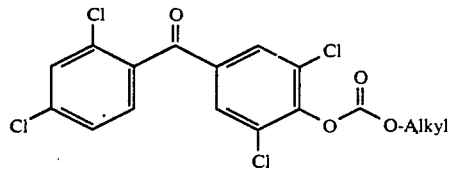

act as herbicides.

If, on the other hand, at least one OH group is introduced ortho to C=O in the parent benzophenone structure, a substance belonging to the Uv stabilizer class is obtained. As is evident in the Example below, chromophores

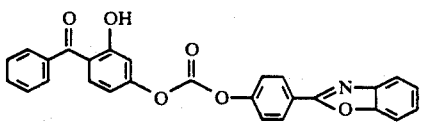

(cf. U.S. Pat. Nos. 3,981,822, 4,115,348 and 4,174,321) or a further structural element having UV-absorbing properties, as described in USSR Patents 352,883 and 491,661 or Japanese Preliminary Published Applications 58-159460 and 61-130 362, are frequently attached to the benzophenone via the carbonate group.

Finally, the noncopolymerizable benzil dimethyl ketals

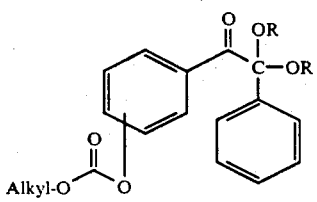

and the benzoin monomethyl ethers

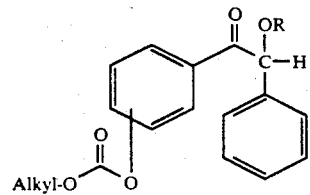

mentioned in Japanese Preliminary Published Application 61-228007 are claimed for photopolymerization.

Thus, only alkyl- and aryl-substituted aceto- and benzophenone carbonates which do not contain a functional group which permits copolymerization have been disclosed to date.

It is an object of the present invention to provide copolymerizable phenone derivatives of the type Scheme VI

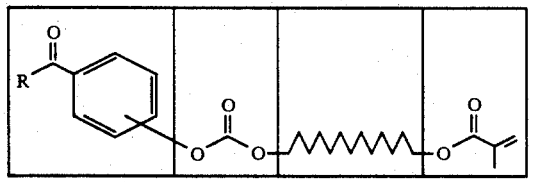

We have found that this object is achieved by ethylenically unsaturated copolymerizable, radiation-sensitive organic compounds of the general formula (I)

where
R is straight-chain alkyl of 1 to 4 carbon atoms, preferably methyl, ethyl or n-propyl, branched, unsubstituted or substituted alkyl of 3 or 4 carbon atoms, such as isopropyl, sec-hydroxyisopropyl, sec-dimethylaminopropyl, sec-morpholinopropyl or tert-butyl, aryl, e.g. phenyl, tolyl or naphthyl, or a radical $R^1$, and $R^1$ is a radical

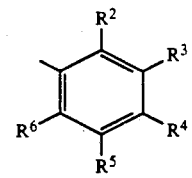

where $R^2$ to $R^6$ are identical or different and are each H, alkyl of 1 to 4 carbon atoms, e.g. methyl, ethyl, n-propyl, isopropyl or tert-butyl, phenyl, OH, $OCH_3$, $OC_2H_5$, SH, $SCH_3$, $SC_2H_5$, F, Cl, Br, CN, COOH, COOAlkyl where alkyl is 1 to 17 carbon atoms, COOAryl, $CF_3$, $N(Alkyl)_2$, $N(Alkyl)(Aryl)$, $N(Aryl)_2$, $N^\oplus(Alkyl)_3 A^\ominus$, $N^\oplus H(Alkyl)_2 A^\ominus$, where alkyl is of 1 to 4 carbon atoms and $A^\ominus$ is the anion of an acid, e.g. $Cl^\ominus$, $SO_4^{2\ominus}$, $PO_4^{3\ominus}$, acetate$^\ominus$, $BF_4^\ominus$, $CF_3SO_3^\ominus$, $SbF_6^\ominus$, $AsF_6^\ominus$ or $PF_6^\ominus$, and at least one but not more than three of the radicals $R^2$ to $R^6$ is a radical

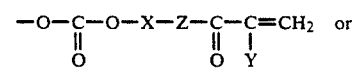

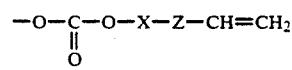

where x is a divalent, unsubstituted or substituted alkylene radical $-(CH_2)_m-$, a radical

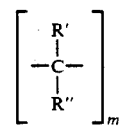

where m is from 1 to 10 and
R' and R'' are identical or different and are each aryl, e.g. phenyl, $C_1-C_4$-alkyl, H, COOH, $COOCH_3$ or $COOC_2H_5$, a perfluorinated alkylene radical $(-CF_2)_m-$ where m is 1 to 10, preferably a perfluoroethylene radical, an oxaalkylene radical of the type $-(CH_2)_n-O-(CH_2)_p-$ where n and p are each from 1 to 5, preferably n and p are each 2, i.e. $-C_2H_4-O-C_2H_4-$, a perfluorinated oxaalkylene radical of the type $-(CF_2)_n-O-(CF_2)_p-$ where n and p are each 1 to 5, for example tetrafluoroethylene, or a polyoxaalkylene radical which may be perfluorinated and has 2 to 20 oxygen atoms which are bonded to one another via at least one $-CH_2-$, $-CF_2-$ or $-CH_2-CH(CH_3)-$ group, or are each an alkylene radical of the type $-(CH_2)_m-O-CO-O-(CH_2)_n-$, $-(CH_2)_n$ $O-CO-NH-(CH_2)_m-$, $-(CH_2)_n-NH-CO-O-(CH_2)_m-$, $-(CH_2)_m-CO-O-(CH_2)_n-$ or $-(CH_2)_m-O-CO-(CH_2)_n-$ where m and n are each from 1 to 10, a phenylene radical which is unsubstituted or substituted by alkyl of 1 to 4 carbon atoms, e.g. methyl, ethyl, n-propyl or isopropyl, OH, $OCH_3$, $OC_2H_5$, SH, $SCH_3$, $SC_2H_5$, Cl, F, $N(Alkyl)_2$ or $N(CH_3)C_6H_5$ in the o-, m- and/or p-position, or a cyclodlkylene radical of 5 to 10 carbon atoms, e.g. cyclohexylene or cyclooctylene, or a (bis)methylenecycloalkylene radical of 6 to 12 carbon atoms, Y is H, alkyl of 1 to 6 carbon atoms or phenyl, Z is O or NY or, if R is aryl, one of the radicals R² or R⁶ may be a sulfur atom by means of which the aryl radical R is bonded in the ortho-position with R¹ and gives, for example, a thioxanthonyl radical.

Surprisingly, the novel compounds have particularly high photochemical reactivity in the short wavelength to relatively long wavelength UV range from 254 to 400 nm and a good shelf life.

It is a further object of the present invention to provide a process for the preparation of novel radiation-sensitive acetophenone, benzophenone and thioxanthone carbonates containing at least one terminal acrylate or methacrylate group.

The synthesis of aryl carbonates without a copolymerizable terminal group is known (Japanese Preliminary Published Applications 59-001 438 and 59-170 033). A good overview is given in: a) Houben-Weyl, Methoden der Organische Chemie, Vol. 8, pages 75, 101–107, Thieme-Verlag 1952, b) Kirk-Othmer, Encyclopedia of Chemical Technology, Vol. 4, pages 758–771, John Wiley 1978, and c) Ullmann's Encyclopedia of Industrial Chemistry, Vol. A5, pages 197–202, Verlag Chemie 1986.

The most important preparation process for carbonates is the reaction of carbonic ester chlorides with alcohols. The procedure is described in detail in Houben-Weyl, Vol. 8 (see above), German Patent 1,080,546 and J. Org. Chem. 26 (1961), 5119. The carbonic esters are formed in good to very good yields if the alcohol and the chlorocarbonic esters are reacted with one another in a molar ratio of 1:1 in the absence of a solvent or in excess alcohol as a solvent. Where the alcohol or the phenol and/or the chlorocarbonic ester are present as solids, aprotic solvents, e.g. dichloromethane, dichloroethane, acetonitrile, toluene, xylene, etc. are used.

There are in principle two routes for the synthesis of the compounds stated in claim 1 (Scheme VII):

Scheme VII

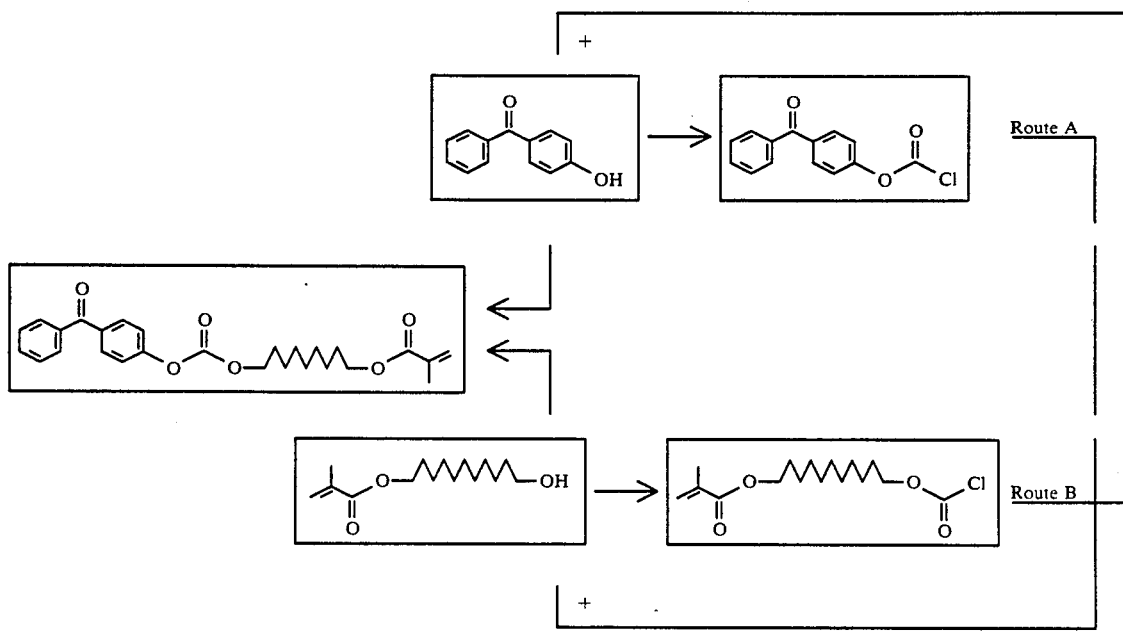

The hydroxyacetophenones and hydroxybenzophenones required as starting materials can be prepared by known processes. For example, 4-hydroxybenzophenone is obtained in a yield of about 90% by Friedel-Crafts acylation of phenol with benzoyl chloride in nitrobenzene in the presence of AlCl₃ or TiCl₄ (Houben-weyl 7/2a, page 186) or in the form of a pure isomer by oxidation of 4-hydroxydiphenylmethane with 5,6-dichloro-2,3-dicyano-p-benzoquinone (Houben-Weyl 7/2a, page 681).

The syntheses of the amino-substituted benzophenones, e.g. 2-benzyl-2-(dimethylamino)-1-(4-hydroxyphenyl)-butan-1-one or 1-(4-hydroxyphenyl)-2-methyl-2-morpholinopropan-1-one, are described in EP-A-284 561 and EP-A-117 233.

2-Hydroxythioxanthone can be prepared from thiosalicylic acid and phenol by the process described in British Patents 2,108,487 (1981) and 2,108,979 (1982).

The aromatic chloroformates (cf. J. Prakt. Chem. 313 (1971), 331, ibid 317 (1975), 62, 73 and 81) of the general formula (IIIb) can be prepared in good yields from a substituted phenol, -e.g. 4-chloro-5'-fluoro-2'-hydroxybenzophenone, 4-chloro-4'-hydroxybenzophenone, 2,4-dihydroxybenzophenone, 4,4'-dihydroxybenzophenone, 4-fluoro-4'-hydroxybenzophenone, 2-hydroxybenzophenone, 4-hydroxybenzophenone, 2-hydroxy-4-methoxybenzophenone, 2,3,4-trihydroxybenzophenone, 2-hydroxythioxanthone, 3-hydroxythioxanthone or 4-hydroxypkkenyl 2-hydroxyprop-2-yl ketone (German Laid-Open Application DOS 3,534,645), by phosgenation with phosgene by standard processes known from the literature, cf. for example Houben-Weyl, Methoden der Organischen Chemie, Vol. 8, Thieme-Verlag 1952, trichloromethyl chloroformate (diphosgene), J. Prakt. Chem. 126 (1930), 210, ibid 128 (1930), 233, Chem. Abstr. 95 81766, J. Org. Chem. 50 (1985), 715, J. Org. Chem. 41 (1976), 2070, Angew. Chem. -U (1977), 267, crystalline triphosgene, Angew. Chem. U (1987), 922, N,N'-carbonyldiimidazole or N,N'-carbonyldi-s-triazole (Fieser 1 (1967), 116).

Merck Kontakte 1981 (1), 14–18, gives information about the use of alternative methods of phosgenation, for example reaction with chlorocarbonic esters.

The hydroxyalkylene (meth)acrylates and hydroxyalkylene (meth)acrylamides are formed by acylation or esterification of suitable α. ω, alkanediols or aminoalcohols, for example 1,2-ethanediol, 1,3-propanediol, 1,2-butanediol, 1,4-butanediol, 1,5-pentanediol, 1,6-hexanediol, 1,4-cyclohexanediol, 1,2-cyclohexanediol, ethanolamine, p-hdyroxyaniline or diols such as polytetrahydrofuran, polyethylene oxide, or polypropylene oxide, with acyl chlorides, esters or anhydrides of acrylaic and methacrylic acid. The transesterification reaction is of particular interest. For example, methyl acrylate, ethyl acrylate, n-butyl acrylate, methyl methacrylate, ethyl methacrylate, propyl methacrylate, n-butyl methacrylate and tert-butyl methacrylate are used for transesterification. Methyl methacrylate is of particular interest. When the process is carried out in practice, the acrylate or methacrylate can be used in less than the stoichiometric amount or, preferably, in excess. In general, from 1 to 1.5 times the molar amount, based on the diol, of the acrylate or methacrylate are used; an excess of from 1.5 to 5 times the amount should be avoided in particular in order to keep the amount of diacrylate to a minimum. In addition, the reaction mixture may contain solvents, e.g. benzene, toluene, xylene, chlorobenzene, dioxane, cyclohexane, n-heptane, n-octane, n-nonane or n-decane. The reaction is preferably carried out in the absence of solvents.

In general, a catalyst conventionally employed for transesterifications is used in the transesterification stage. Examples of suitable catalysts rae alkali metal alcoholates, such as sodium methylate, ethylate or propylate, lithium methylate and, preferably, compounds of titanium, tin and zirconium. Examples are titanium tetramethylate, tetraethylate, tetrapropylate and tetrabutylate, dibutyltin oxide, dibutyltin dilaurate, dimethoxydibutyltin and zirconium pentane-2,4-dionate.

The amount of catalyst are frequently from 0.0005 to 0.5, preferably from 0.001 to 0.02, mole of catalyst per mole of diol. The transesterification is generally carried out at from 50° to 150° C., preferably from 80° to 120° C., with boiling of the reaction mixture, if necessary the alkanol liberated during the transesterification being distilled off from the reaction mixture together with some of the acrylate or methacrylate, as an azeotropic mixture.

After the transesterification reaction has been carried out, the excess acrylates or methacrylates and any solvent can be separated off from the reaction mixture, for example, by distillation, preferably under reduced pressure. If desired, the monohydroxyalkylene (meth)acrylate obtained can be purified, for example by distillation under reduced pressure, by extraction or by crystallization. However, it is also possible for the reaction product of the transesterificaiton stage to be fed to the next stage of the process without further purification or, if necessary, after removal of the catalyst or of its salt by hydrolysis and filtration.

In carrying out the acylation with (meth)acrylic anhydride, the educts are preferably used in stoichiometric amounts. The reaction is carried 'out in general at from 80° to 140° C., preferably from 90° to 110° C. Particularly suitable catalysts are acids, in particular concentrated sulfuric acid, which are used in amounts of from 0.1 to 2 mol %. After the catalyst and (meth)acrylic acid have been separated off, for example by neutralizaiton with an aqueous base, e.g. sodium carbonate solution or dilute sodium hydroxide solution, the crude product an be used in the next stage without further purification, if necessary after drying, for example with sodium sulfate or magnesium sulfate.

To prevent premature polymerization of the α, β-monoolefinically unsaturated reactions, a conventional stabilizer is preferably added to the reaction mixture. Examples of suitable stabilizers are hydroquinone, hydroquinone monomethyl ether, 2,6-di-tert-butyl-4-methylphenol, para-nitrosophenol and/or phenothiazine. Furthermore, it has proven extremely advantageous to pass oxygen or air through the reaction mixture during the acylation.

The hydroxylakyl or hydroxyalkylene monovinyl ether are obtainable in good yields by the process described in Liebigs Ann. Chem. 601 (1956), 81.

The following (meth)acrylates, (meth)acrylamides and hydroxyalkyl vinyl ethers which can be used according to the invention may be mentioned by way of example:

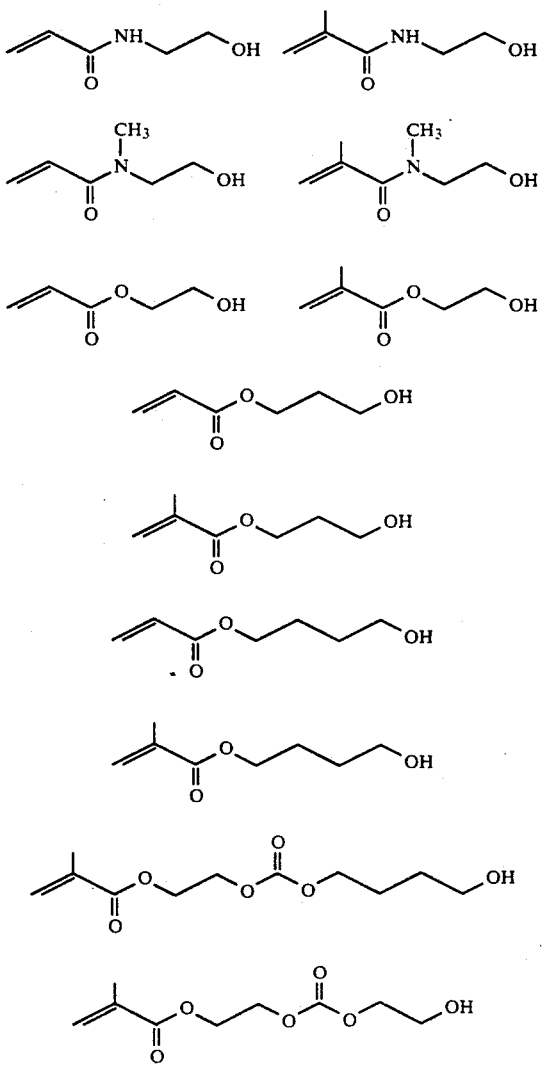

-continued

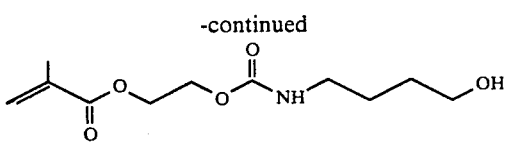
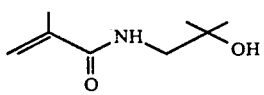
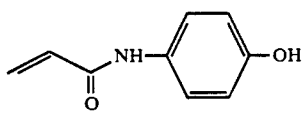
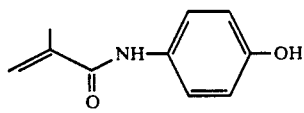
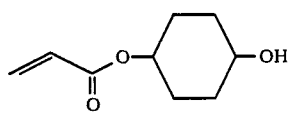
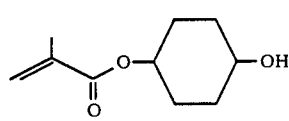
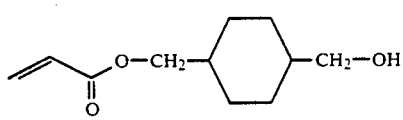
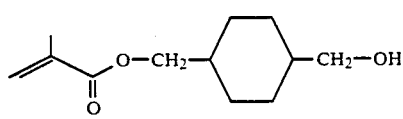
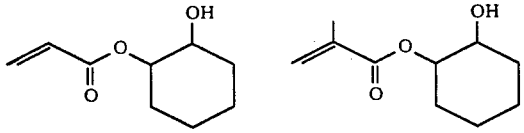

cf. also CA 86, 107063a
(Deposited Doc. 1974, VINITI 2066-74)

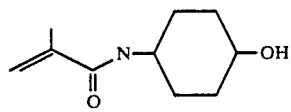
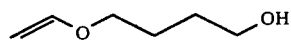
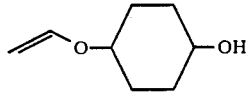

-continued

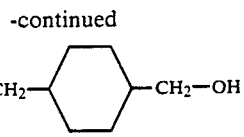

For the reaction of the hydroxyacetophenones, hydroxybenzophenones or hydroxythioxanthones, the corresponding ω-(meth)acryloyloxyalky chloroformates are generally required. These can be prepared conveniently and in good yields by processes known from the literature, as described in, for example, Eur. Polym. J. 14 (1978), 205; J. Polym. Sci. Polym. Symp. 66 (1979), 41; Bull. Soc. Chim. Belg. 93 (1984), 159.

Surprisingly, we have found that the novel acetophenone, benzophenone and thioxanthone derivatives are obtainable readily and in very good yield by the routes A and B shown in Scheme VII. This is unexpected particularly in view of the reactivity and bifunctionality of the (meth)acrylate or vinyl ether component, since many different reaction products are possible. Routes A and B differ in particular from the variant described in DE-A-3 820 463, in which isocyanates which are toxic and difficult to obtain are used under neutral conditions.

Routes A and B are more economical, more efficient and, because of the bifunctionality of the starting materials, novel compared with the prior art (cf. Houben-Weyl, Vol. 8, pages 75, 101–107).

The present invention furthermore relates to a process for the preparation of compounds of the general formula (I), wherein a compound of the formula IIa) or (IIb)

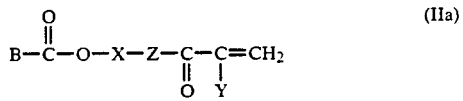 (IIa)

or

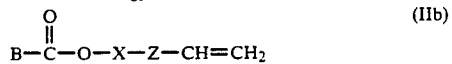 (IIb)

where
X, Y and Z have the abovementioned meanings and B is one of the groups tosylate, alkoxy of 1 to 5 carbon atoms, halogen, e.g. Cl or Br, chlorocarbonyl, imidazolyl, pyrazolyl or an ammonium, pyridinium, phosphonium or sulfonium cation, preferably, for example, 2-(acryloyloxy)-ethyl or 2-(methacryloyloxy)-ethyl chlorocarbonate, 2-(methacryloyloxy)-ethyl chloroglyoxylate or 2-(meth)acryloyloxyethyl methyl carbonate, is reacted with a compound of the general formula (IIIA)

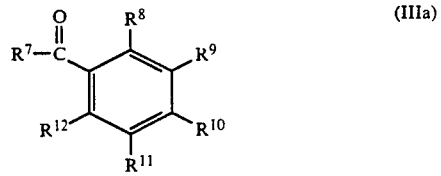 (IIIa)

where
$R^7$ is straight-chain alkyl of 1 to 4 carbon atoms, branched, unsubstituted or substituted alkyl of 3 or 4 carbon atoms, aryl or a radical $R^1$ and
$R^8$ to $R^{12}$ are identical or different and are each H, alkyl of 1 to 4 carbon atoms, phenyl, OH, $OCH_3$, OC$_2$H$_5$, SH, SCH$_3$, SC$_2$H$_5$, F, Cl, Br, CN, COOH, COOAlkyl where alkyl is of 1 to 17 carbon atoms, COOAryl, CF$_3$, N(Alkyl)$_2$, N(Alkyl)-(Aryl), N(Aryl)$_2$,1 N$^\oplus$(Alkyl)$_3$A$^\ominus$ or N$^\oplus$H(Alkyl)$_2$A$^\ominus$ where alkyl is of 1 to 4 carbon atoms, and A$^\ominus$ is the anion of an acid, e.g. Cl$^\ominus$ SO$_4^{2\ominus}$, PO$_4^{3\ominus}$, acetate$^\ominus$, BF$_4^\ominus$, CF$_3$SO$_3^\ominus$, AsF$_6^\ominus$, SbF$_6^\ominus$, PF$_6^\ominus$ etc., or one of the radicals R$^8$ or R$^{12}$ is a sulfur atom by means of which the aryl radical is bonded in the ortho-position with R$^7$, with the proviso that at least one of the radicals R$^6$ to R$^{12}$ is hydroxyl, in an equimolar ratio (if necessary with up to 20% excess) or, depending on the number of hydroxyl groups in the radicals R$^8$ to R$^{12}$, in two or three times the equimolar ratio, in the presence or absence of an inert solvent or solvent mixture and of a basic catalyst, at from 0° to 100° C. under anhydrous conditions (route B).

The present invention furthermore relates to a process for the preparation of compounds of the general formula (I), wherein a compound of the formula (IVa) or (IVb)

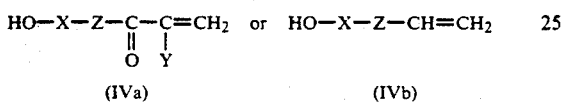

(IVa)                    (IVb)

where

X, Y and Z have the meanings stated in claim 1, preferably the (meth)acrylates, methacrylamides or hydroxyalkyl vinyl ethers stated above by way of example, is reacted with a compound of the general formula (IIIb)

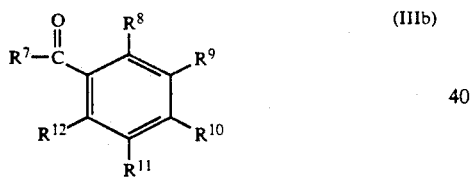

(IIIb)

where

R$^7$ is straight-chain alkyl of 1 to 4 carbon atoms, preferably methyl, ethyl or n-propyl, branched, unsubstituted or substituted alkyl of 3 or 4 carbon atoms, such as iso-propyl, hydroxyisopropyl, dimethylaminopropyl, morpholinopropyl or tert-butyl, or aryl, e.g. phenyl, tolyl or naphthyl, preferably phenyl, and R$^8$ to R$^{12}$ are identical or different and are each H, alkyl of 1 to 4 carbon atoms, e.g. methyl, ethyl, n-propyl, iso-propyl or tert-butyl, phenyl, OH, OCH3l OC2H5, SH, SCH$_3$, SC$_2$H$_5$, F, Cl, Br, CN, COOH, COOAlkyl where alkyl is of 1 to 17 carbon atoms, COOAryl, CF$_3$, N(Alkyl)$_2$, N(Alkyl)-(Aryl), N(Alkyl)$_2$, N$^\oplus$(Alkyl$_3$A$^\ominus$, or N$^\oplus$H(Alkyl)$_2$A$^\ominus$ where alkyl is of 1 to 4 carbon atoms, and A? is the anion of an acid, e.g. Cl$^\ominus$, SO$_4^{2\ominus}$, PO$_4^{3\oplus}$, acetate$^\ominus$, BF$_4^\ominus$, CF$_3$SO$_3^\ominus$, AsF$_6^\ominus$, SbF$_5^\ominus$, PF$_6^\ominus$, etc., or one of the radicals R$^8$ or R$^{12}$ may be a sulfur atom by means of which the aryl radical is bonded in the ortho-position with R$^7$, with the proviso that at least one of the radicals R$^8$ to R$^{12}$ is a group of the type B—CO—O, where B has the meanings stated in formulae (IIa) and (IIb), for example

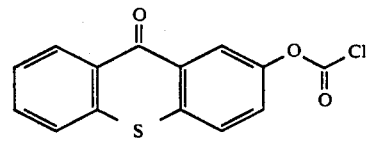

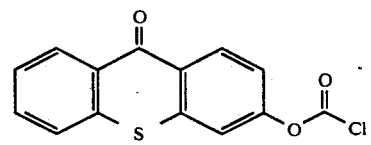

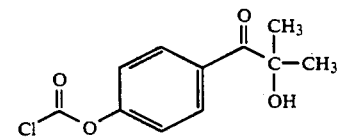

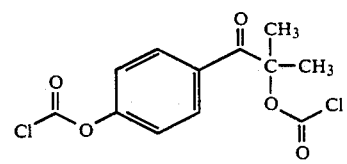

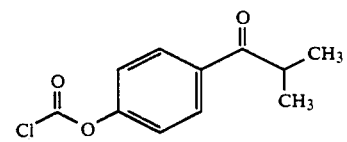

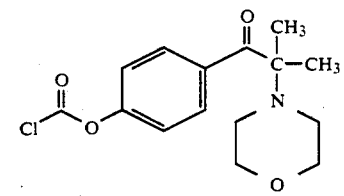

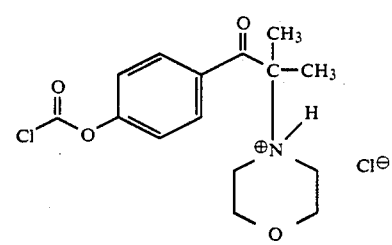

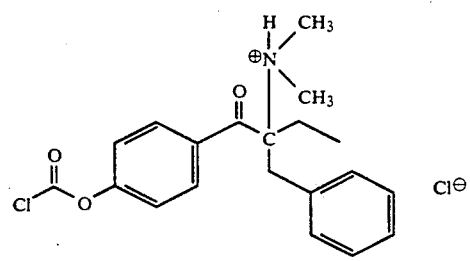

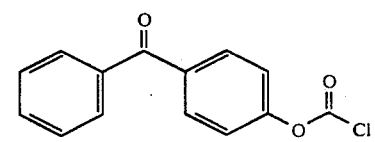

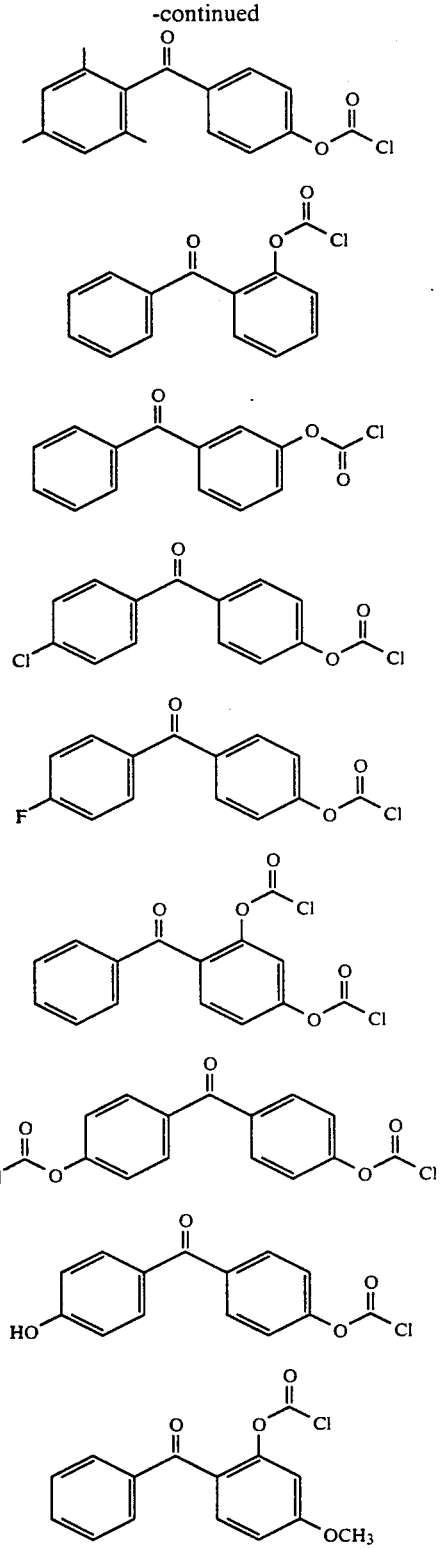

in an equimolar ratio (if necessary in an excess of up to 10–30%) or, depending on the number of B—CO—O groups in the radicals $R^8$ to $R^{12}$, in two or three times the equimolar ratio, in the absence of moisture and in the presence or absence of an inert solvent or solvent mixture and of a basic catalyst, at from 0° to 100° C., preferably from 20° to 50° C. (route A).

Regarding the preparation process, the following may be stated specifically.

The chloroformates used in the reaction react readily with nucleophiles, including water. In the reaction, it is therefore essential to exclude moisture by using dried nonnucleophilic solvents, e.g. acetonitrile, dichloromethane, dichloroethane, tetrahydrofuran, toluene, xylene, chlorobenzene, ethyl acetate, chloroform, etc., and if necessary to maintain an inert gas atmosphere, for example nitrogen, argon or carbon dioxide.

As a rule, a solution or suspension of the hydroxy compound in an inert solvent, which may be omitted if the compound is a liquid at the reaction temperature, is initially taken at from 0° to 100° C., preferably from 10° to 500° C., in the presence of a basic, nonnucleophilic amine, preferably triethylamine, 4dimethylaminopyridine, imidazole, 1,4-diazabicyclo[2.2.2]octane, 1,5-diazabicyclo[4.3.0]non-5ene, 1,8-diazabicyclo[5.4.0]undec-7-ene, polyvinylpyridine, N,N'-dimethylpropyleneurea, N,N'-dimethylethyleneurea, etc. The chloroformyl compound, if necessary dissolved in an inert solvent, e.g. dichloromethane, dichloroethane, acetonitrile, toluene, chlorobenzene, xylene, etc., is then added dropwise while stirring in the abovementioned temperature range. This procedure is particularly suitable for relatively large batches.

After stirring has been carried out for from 1 to 48, preferably from 1 to 20, hours at from 10° to 400° C., filtration, washing and drying are carried out by standard methods and the product is isolated after recrystallization, distillation or extraction.

The acetophenones, benzophenones and thioxanthones into which functional groups have been introduced according to the invention are suitable as photoinitiators, which are polymerizable or copolymerizable with unsaturated compounds, for radiation-curable compositions.

Surprisingly, we have found that, from a certain spacer length upward, the photoinitiators provided with the carbonate group are more reactive after photochemical excitation than the derivatives described in, for example, DE-A-37 38 567. In contrast to the carbamoyl derivatives described in DE-A-38 40 463, the carbonates in the irradiated polymer do not tend to yellow and are completely odorless and universally applicable since they are readily compatible with many binders and binder systems.

For all compounds stated in the Examples below, the structure was confirmed in some cases by independent syntheses and in all cases by correct $^1$H-NMR, IR and mass spectra and by conforming elemental analyses.

EXAMPLE 1

4-Chloroformylbenzophenone

A total of 3.4 kg of phosgene were passed in the course of 5 hours into a solution of 4 kg of 4-hydroxybenzophenone and 190 g of benzyltrimethylammonium chloride in 11.4 kg of o-xylene. During this time, the internal temperature was increased from 95° to 1200° C. After the end of the introduction of phosgene, stirring was continued for 30 minutes at 115° C. Working up was carried out by expelling the excess phosgene with nitrogen. The salt (catalyst) precipitated toward the end of the reaction was filtered off and the solvent was distilled off. 4.9 kg (93%) of yellowish 4-chloroformylbenzophenone of melting point 67°–72° C. were obtained. This crude product containing 12.69% of Cl⁻(theoretical value 13.60%) was used directly for the subsequent reactions, without further purification.

The following chloroformyl compounds were prepared by a method similar to that stated in Example 1:

EXAMPLE 2

2-Chloroformylthioxanthone (Cl: calculated=12.19%; found=12.03%) was obtained in 79% yield from 2-hydroxythioxanthone.

EXAMPLE 3

3-Chloroformylthioxanthone was obtainable in 63% yield from 3-hydroxythioxanthone- (Cl: calculated=12.19%; found=11.22%).

EXAMPLE 4

4-Chloroformylphenyl 2-hydroxyprop-2-yl ketone was obtained as a crude product (Cl: calculated=14.61%; found =13.07%) in 75% yield from 4-hydroxyphenyl 2-hydroxyprop-2-yl ketone.

EXAMPLE 5

Phosgenation of 1-(4-hydroxyphenyl)-2-methyl-2-morpholinopropan-1-one first gave the hydrochloride, which could be converted into the free amine after the careful addition of 1,5-diazabicyclo[4.3.0]non-5-ene; yield: 62% (Cl: calculated=11.37%; found=11.21%).

EXAMPLE 6

4,4'-Benzoylphenyl ethyl carbonate 1.3 kg of 4-chloroformylbenzophenone in 2.2 kg of tetrahydrofuran were added dropwise at room temperature to a solution of 0.25 kg of ethanol and 0.53 kg of triethylamine in 1.33 kg of tetrahydrofuran. The mixture was refluxed for 1 hour, cooled to 25°–30° C. and then stirred into 20 kg of ice water. The aqueous phase was extracted three times with dichloromethane and the organic phase was dried over sodium sulfate and evaporated down under reduced pressure. The residue was recrystallized from reethanol. 1.05 kg (78%) of pale crystals of melting point 121°–1220° C. were obtained.

The 4,4'-benzoylphenyl ethyl carbonate was identical to authentic material (Can. J. Chem. 56 (1978), 1031).

EXAMPLES 7 TO 18

The asymmetric carbonates below were prepared by a method similar to that stated in Example 6.

| No. | Compound | Yield [%] |
| --- | --- | --- |
| 7 | (structure) | 83 |
| 8 | (structure) | 58 |
| 9 | (structure) | 65 |
| 10 | (structure) | 67 |
| 11 | (structure) | 75 |
| 12 | (structure) | 69 |

-continued

| No. | Compound | Yield [%] |
|---|---|---|
| 13 | (tBu-O-CO-O)-C6H4-C(=O)-C(CH3)2-OH | 52 |
| 14 | H3CO-CO-O-C6H4-C(=O)-CH(CH3)2 | 88 |
| 15 | H3CO-CO-O-C6H4-C(=O)-C(CH3)2-N(morpholino) | 73 |
| 16 | 2-(methoxycarbonyloxy)-thioxanthone benzoyl derivative | 72 |
| 17 | 2-(ethoxycarbonyloxy)-thioxanthone benzoyl derivative | 77 |
| 18 | thioxanthone-aryl-O-CO-OC2H5 | 70 |

EXAMPLE 19 monocarbonate ester of 4-hydroxybenzophere and 4-hydroxybutyl acrylate 13.0 kg of 4-chloroformylbenzophenone in 22 kg of toluene were added dropwise at from 25° to 300° C. to a solution of 7.2 kg of butanediol monoacrylate and 5.3 kg of triethylamine in 17 kg of toluene. The mixture was stirred for 2 hours at room temperature and then washed in succession with water, with sodium bicarbonate solution and then with water. The organic phase was dried over sodium sulfate and evaporated down under reduced pressure from a water pump. 17.9 kg (97%) of a yellow-ish, viscous liquid, which was found to be pure by thin-layer chromatography were isolated.

EXAMPLE 20

0.91 kg of 2-hydroxythioxanthone was suspended in a solution of 0.5 kg of triethylamine and 4.3 kg of toluene, and a solution of 0.81 kg of 2-chloroformyl ethyl methacrylate in 1.7 kg of toluene was slowly added dropwise to this mixture at from 20 to 240C. After the addition of 0.002 kg of phenothiazine, stirring was carried out for 18 hours at room temperature. The organic phase was then washed with water, with sodium bicarbonate solution and again with water, dried over sodium sulfate and evaporated down under reduced pressure from a water pump, and the residue was recrystallized from isopropanol.

0.97 kg (63%) of yellow crystals of melting point 72°–76° C. was obtained.

EXAMPLES 21 TO 34

The following compounds were synthesized by methods similar to those described in detail in Examples 19 and 20:

| No. | Compound | Yield [%] |
|---|---|---|
| 21 | (benzoyl-phenyl) carbonate ethyl methacrylate | 89 |
| 22 | (benzoyl-phenyl) carbonate ethyl acrylate | 94 |
| 23 | (benzoyl-phenyl) carbonate 2-(vinyl ketone)ethyl ether | 95 |
| 24 | (benzoyl-phenyl) carbonate propyl acrylate | 49 |
| 25 | (2-hydroxy-2-methylpropanoyl-phenyl) carbonate butyl acrylate | 64 |
| 26 | (2-hydroxy-2-methylpropanoyl-phenyl) carbonate ethyl methacrylate | 71 |
| 27 | (2-morpholino-2-methylpropanoyl-phenyl) carbonate ethyl methacrylate | 76 |
| 28 | (thioxanthonyl) carbonate butyl acrylate | 58 |
| 29 | (benzoyl-phenyl) carbonate (acrylamido-phenyl) | 73 |

-continued

| No. | Compound | Yield [%] |
|---|---|---|
| 30 | | 97 |
| 31 | | 42 |
| 32 | | 88 |
| 33 | | 79 |
| 34 | | 82 |

EXAMPLES 35 TO 53

Use of the acetophenone, benzophenone and thioxanthone derivatives as photoinitiators From 0.1 to 0.3 g of the photoinitiator to be tested, together with from 0.2 to 0.3 g of an amine and, if required, a sensitizer, are dissolved in a model polymer consisting of 62% by weight of a bifunctional epoxyacrylate (acrylate derived from bisphenol glycidyl ether), 35% by weight of hexanediol acrylate and 3% by weight of butanol (viscosity adjustment, film formation) and the solution is stirred for 1 hour. During this time, the measuring cell is prepared. It consists of two highly transparent NaCl windows separated by two films, each of which is 25 μm thick. The polymer sample to be measured is now applied to one of the films and covered with the other, and the stack is clamped with the NaCl windows in a metal frame in such a way that a film about 10-30 μm thick forms between the films.

This sandwich is exposed to a very high pressure mercury lamp (HBO 200 W) at a distance of 51 cm, interference filters furthermore permitting the selection of only one particular wavelength (e.g. 330, 365 or 404 ran).

Before exposure, an IR spectrum of the sample sandwich is recorded (t=0) and this procedure is repeated after exposure for 5 seconds. In the case of a good photoinitiator, the intensity of the bands assigned to the acrylate groups has decreased substantially while those of the aromatic internal standard remain unchanged. A number characteristic of the photoinitiator can be calculated from this for each band.

This evaluation is carried out for the three most intense acrylate bands and the values are added to give the initiator characteristic. This characteristic is purely a relative number and is from 1 to 15. The better the initiation of the polymerization by an initiator, the higher is its characteristic.

The characteristics correlate with the parameters typical of photopolymers, such as pencil hardness and König pendulum hardness.

The following values were found:

| Example No. | Compound | Sensitizer | Initiator characteristic |
|---|---|---|---|
| 35 | benzophenone | — | 5.4 |
| 36 | benzophenone | Michler's Ketone | 10.7 |
| 37 | benzoyl dimethyl ketal (phenyl-C(=O)-C(OCH₃)₂-phenyl) | — | 8.3 |
| 38 | 2-hydroxy-2-methyl-1-phenyl-propan-1-one | — | 9.8 |
| 39 | 1-[4-(2-hydroxyethoxy)phenyl]-2-hydroxy-2-methylpropan-1-one | — | 2.8 |
| 40 | 2-methyl-1-(4-hydroxyphenyl)-2-morpholino-propan-1-one | — | 4.2 |

-continued

| Example No. | Compound | Sensitizer | Initiator characteristic |
|---|---|---|---|
| 41 | [structure] | — | 4.7 |
| 42 | [structure] | — | 5.0 |
| 43 | [structure] | — | 6.1 |
| 44 | [structure] | — | 5.5 |
| 45 | [structure] | — | 9.1 |

-continued

| Example No. | Compound | Sensitizer | Initiator characteristic |
|---|---|---|---|
| 46 | | — | 11.4 |
| 47 | | Michler's Ketone | 11.7 |
| 48 | | — | 7.3 |
| 49 | | — | 8.4 |
| 50 | | — | 10.1 |

-continued

| Example No. | Compound | Sensitizer | Initiator characteristic |
|---|---|---|---|
| 51 | (structure) | — | 8.9 |
| 52 | (structure) | Thioxanthone | 10.5 |
| 53 | (structure) | (structure) | 9.5 |

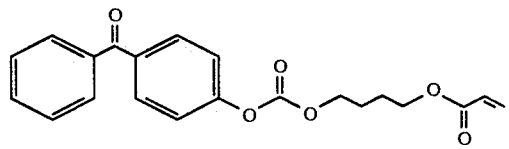

We claim:
1. An ethylenically unsaturated copolymerizable, radiation-sensitive organic compound of the formula (I)

   (I)

where
R is aryl or a radical $R^1$ and
$R^1$ is a radical

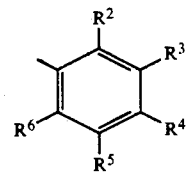

where
$R^2$ and $R^6$ are identical or different and each of the radicals can be H or one of the radicals

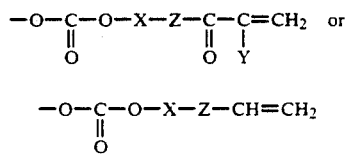

$R^3$ to $R^5$ are identical or different and each is H, alkyl of 1 to 4 carbon atoms, phenyl, $OCH_3$, $OC_2H_5$, F, Cl, Br, CN, COOAlkyl where alkyl is 1 to 17 carbon atoms, COOAryl, $CF_3$, $N(Alkyl)_2$, $N(Alkyl)$-$(Aryl)$, $N(Aryl)_2$, $N^{\ominus}(Alkyl)_3 A^{\ominus}$ or $N^{\oplus}H(Alkyl)_2 A^{\ominus}$ where alkyl is of 1 to 4 carbon atoms, and $A^{\ominus}$ is the anion of an acid, and one of the radicals

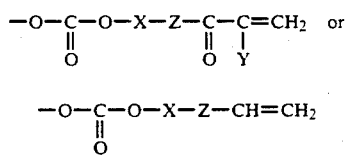

where at least one of the radicals $R^2$ to $R^6$ is a radical

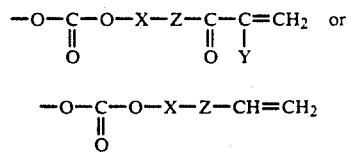

where
X is a divalent, unsubstituted or substituted alkylene radical $-(CH_2)_m-$ or

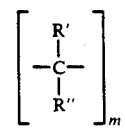

where m is from 1 to 10 and
R' and R" are identical of different and each is H or alkyl, an oxaalkylene radical $-(CH_2)_n-O-(CH_2)_p-$ where n and p are each from 1 to 5, or a polyoxaalkylene radical having 2 to 20 oxygen atoms which are bonded to one another via at least one $-CH_2-$ or $-CH_2-CH(CH_3)-$group, or a radical $-(CH_2)_m-O-CO-O-(CH_2)_n-$, $-(CH_2)_n-NH-CO-O-(CH_2)_m-$, $-(CH_2)_m-CO-O-(CH_2)_n$ or $-(CH_2)_m-O-CO-(CH_2)_n-$ where m and n are each from 1 to 10, an unsubstituted or substituted cycloalkylene radical of 5 to 10 carbon atoms, a (bis)methylenecycloalkylene radical of 6 to 12 carbon atoms or an unsubstituted or substituted o-, m- or p-phenylene radical,
Y is H, alkyl of 1 to 6 carbon atoms or phenyl and
Z is O.
2. The compound of the formula